(12) United States Patent
Sitch

(10) Patent No.: US 7,388,535 B1
(45) Date of Patent: Jun. 17, 2008

(54) DIGITIZING FRONT END FOR OPTICAL RECEIVER

(75) Inventor: John Edward Sitch, Ottawa (CA)

(73) Assignee: Nortel Networks Limited (CA)

( * ) Notice: Subject to any disclaimer, the term of this patent is extended or adjusted under 35 U.S.C. 154(b) by 0 days.

(21) Appl. No.: 11/458,737

(22) Filed: Jul. 20, 2006

(51) Int. Cl.
*H03M 1/12* (2006.01)

(52) U.S. Cl. .................. 341/155; 341/137; 341/139; 341/141

(58) Field of Classification Search .............. 341/137, 341/155
See application file for complete search history.

(56) References Cited

U.S. PATENT DOCUMENTS

| | | | | |
|---|---|---|---|---|
| 5,353,143 | A | * | 10/1994 | Clarke ........................ 398/99 |
| 6,380,880 | B1 | * | 4/2002 | Bidermann ................. 341/155 |
| 6,670,903 | B2 | * | 12/2003 | Fujita et al. ................ 341/155 |
| 7,127,007 | B2 | * | 10/2006 | Agazzi ....................... 375/316 |
| 7,206,062 | B2 | * | 4/2007 | Asbrock et al. ........... 356/4.03 |
| 7,215,721 | B2 | * | 5/2007 | Hietala et al. .............. 375/317 |
| 7,251,297 | B2 | * | 7/2007 | Agazzi ....................... 375/340 |
| 2007/0133722 | A1 | * | 6/2007 | Agazzi et al. ............. 375/346 |

* cited by examiner

*Primary Examiner*—Khai M Nguyen
(74) *Attorney, Agent, or Firm*—Anderson Gorecki & Manaras LLP

(57) ABSTRACT

A sampled-data-integrating front end is employed to convert an optical signal to a digital electrical signal. The front end includes a photodetector and an array of parallel conversion circuits, each including an activation switch, a charge amplifier and an Analog to Digital Converter ("ADC"). The charge amplifier includes a reset switch, a capacitor, and an amplifier. The resent switch is operable to discharge the capacitor. The capacitor is operable to charge to the voltage of a signal charge when the activation switch is closed, and to hold that voltage after the activation switch is opened. The amplifier is operable to provide current at the voltage across the capacitor for a period sufficient to enable the ADC to obtain an accurate sample. The parallel conversion circuits are time-interleaved to provide a selected resolution in the digital electrical representation of the optical signal.

14 Claims, 2 Drawing Sheets

DIGITIZING FRONT END FOR OPTICAL RECEIVER

FIELD OF THE INVENTION

This invention relates generally to the field of network communications, and more particularly to conversion of an optical signal to a digital electrical signal.

BACKGROUND OF THE INVENTION

Optical links are widely used to move data between devices in a communications network. In comparison with electrical links, optical links have greater range and can transport more data per unit of physical media. Although network devices capable of all-optical operation are known, it is more typical that the receiving device performs signal processing in the digital electrical domain. It is therefore necessary to convert the received optical signal to a digital electrical signal at the receiving device so that processing may be done.

Circuits for converting signals from the optical domain to the digital electrical domain are known. As shown in FIG. 1, a continuous-time front end includes a PIN diode (100), a discrete, low noise transimpedence pre-amp (102) and Automatic Gain Control ("AGC") amplifier (104) connected with an array of Analog to Digital Converter ("ADC") circuits ($106_1$-$106_n$). The PIN diode is used to convert the incoming optical signal to an electrical signal. The low noise transimpedance pre-amplifier and AGC amplifier are used to provide analog signal conditioning, such as the requisite voltage level and current to drive time-interleaved ADCs. The ADCs are time-interleaved in order to permit an effectively lower clock rate in each individual ADC circuit relative to the optical signal. Track-and-hold or possibly sample-and-hold circuits (shown as transistor switches in FIG. 1) are employed to select individual ADC circuits. In particular, the ADCs are selected in round-robin such that only one ADC circuit is selected at a given point in time. However, continuous time front ends have some drawbacks. In particular, they have limited dynamic range and require frequency response equalization. Discrete pre-amps and AGCs also require space, dissipate power and are relatively costly. Further, interconnecting the discrete elements in a manner that provides adequate bandwidth can be difficult, and it seems impractical to integrate a conventional pre-amp and AGC into a CMOS chip that is also capable of the required ADC and Digital Signal Processing ("DSP") functions.

SUMMARY OF THE INVENTION

In accordance with one embodiment of the invention, apparatus operable to convert an optical signal to a digital electrical signal comprises: at least one photodetector; and a plurality of parallel conversion circuits interconnectable with the photodetector, each conversion circuit including first switch means for selectively placing the conversion circuit in communication with the photodetector, a charge amplifier operable to produce a voltage corresponding to a reference charge from the photodetector, and an analog to digital converter operable in response to produce a digital electrical representation of the optical signal.

In accordance with another embodiment of the invention, a method of converting an optical signal to a digital electrical signal comprises the steps of: producing a reference charge from an optical signal with at least one photodetector; and with one of a plurality of parallel conversion circuits interconnectable with the photodetector: selectively placing the conversion circuit in communication with the photodetector using first switch means, producing a voltage corresponding to a signal charge from the photodetector using a charge amplifier, and producing a digital electrical representation of the optical signal using an analog to digital converter.

Advantages associated with some embodiments of the invention include integrating an optical front end on a single CMOS chip, improved sensitivity, power savings, and simplified calibration. Integration onto a single CMOS chip is made possible by obviating the need for an external low-noise preamp and AGC. Sensitivity is improved because charge integrating is employed rather than trans-impedance pre-amplification. Power savings is realized because total signal gain between the photodetector and ADC is reduced. Calibration is simplified because analog signal conditioning is performed on sampled data.

DETAILED DESCRIPTION

Figure 1:
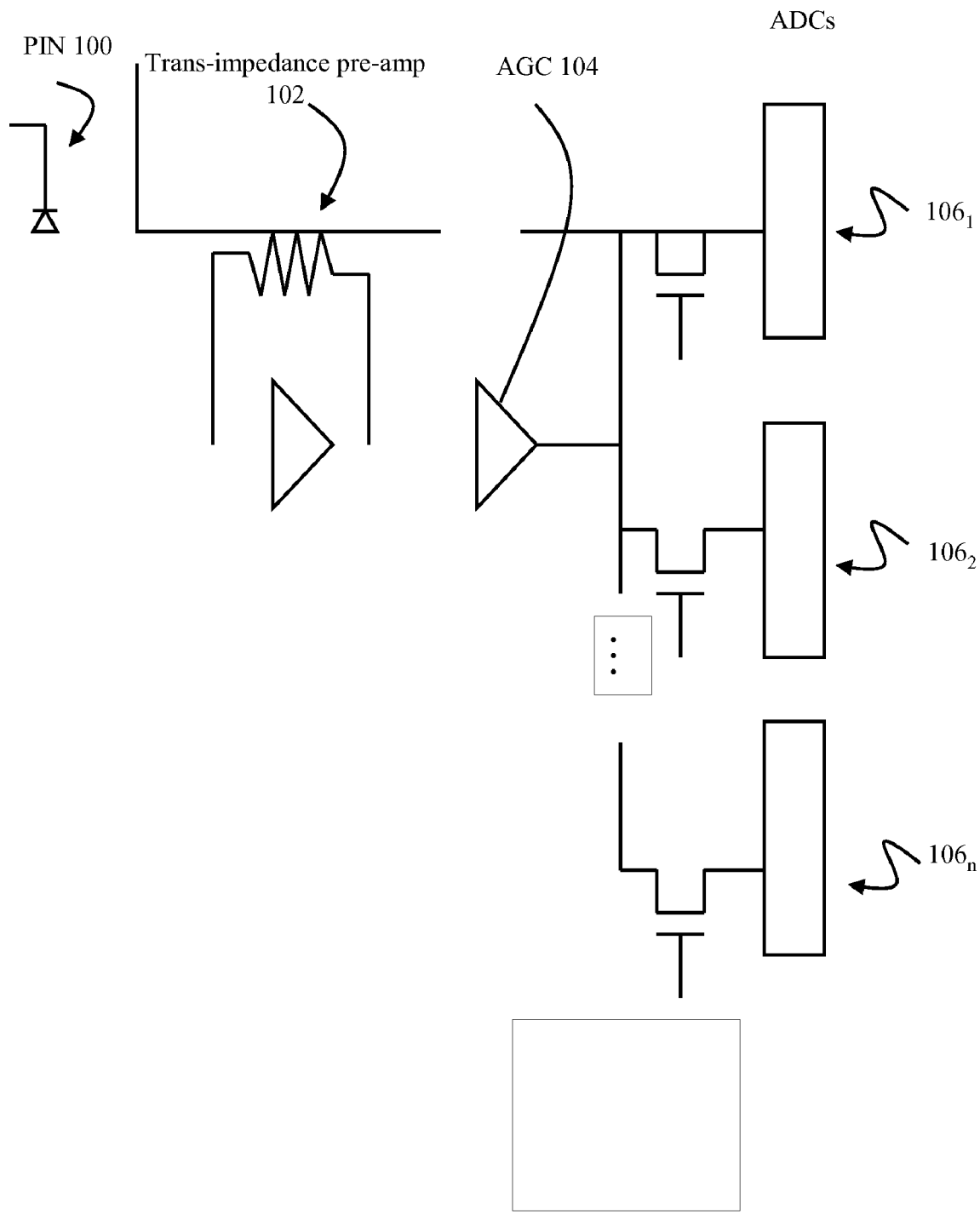
FIG. 1 is a diagram of a prior art continuous-time front end.
Figure 2:
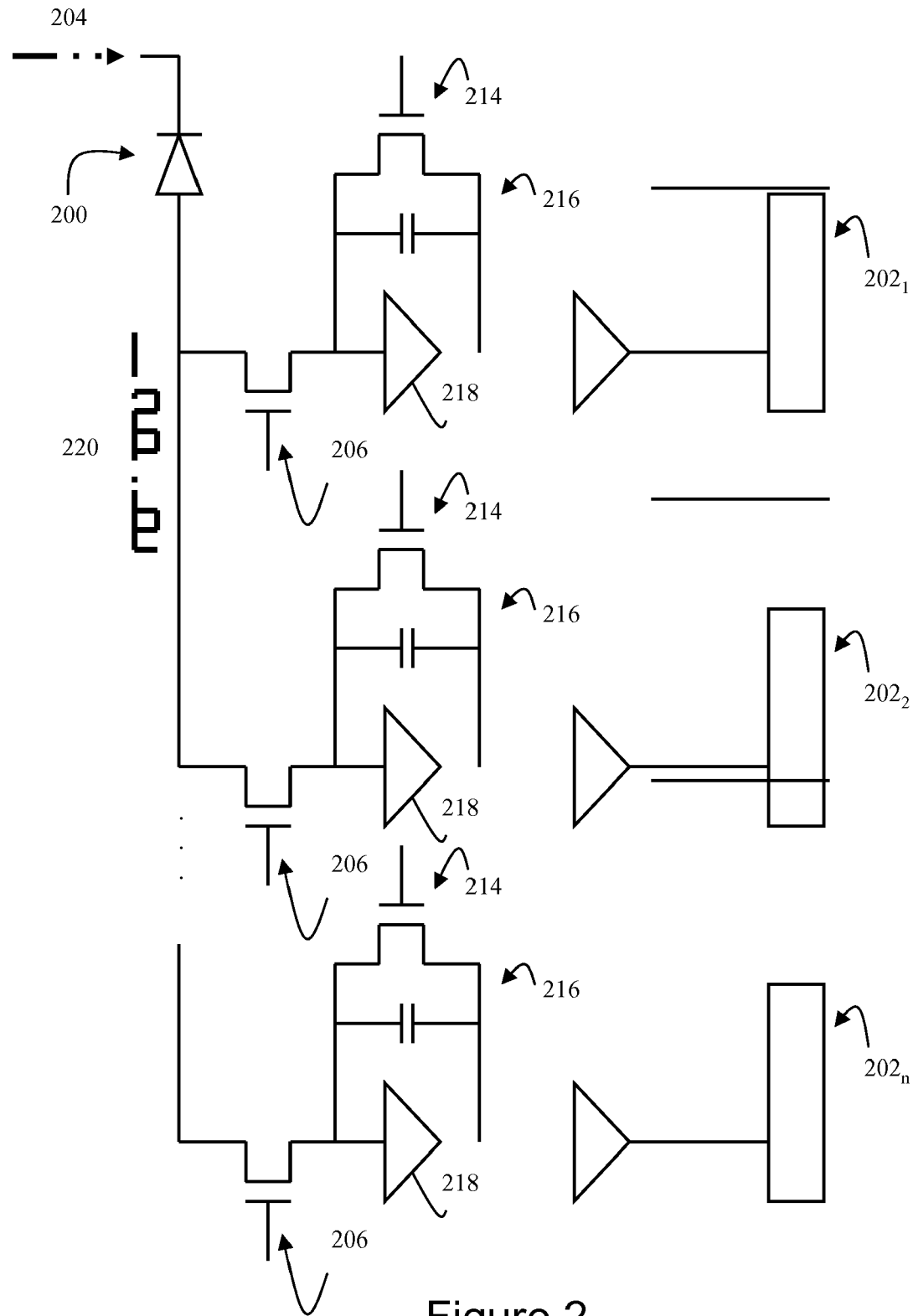
FIG. 2 is a diagram of a sampled-data-integrating front end.

Referring now to FIG. 2, a sampled-data-integrating front end for use with communications equipment includes a photodetector (200) and an array of parallel conversion circuits ($202_1$-$202_n$). The photodetector, which is responsive to an inputted optical signal (204), can be a PIN diode, APD, or any other component or subsystem that converts a signal from the optical domain to the electrical domain. Each conversion circuit (202) includes an activating switch component (206) such as a transistor, a charge amplifier (208), and Automatic Gain Control ("AGC") amplifier (210), and an Analog to Digital Converter ("ADC") (212). The charge amplifier (208) includes a reset switch component (214), a capacitor (216) and an amplifier (218). The conversion circuits are each operable in response to an electrical signal (220) produced by the photodetector (200) in response to the inputted optical signal (204). In particular, the conversion circuit will produce a digital, electrical representation of a sample of the signal provided by the photodetector.

A series of clocked steps govern the taking of a sample by a conversion circuit (202). In order to prepare to take a sample, the reset switch component (214) of the charge amplifier (208) is activated, i.e., the switch is closed, in order to discharge the capacitor. The switch component remains activated for a predetermined period of time, following which the component is deactivated, i.e., the switch is opened. The period of time over which the sample is taken is determined by the switch component (206) between the photodetector and the charge amplifier. When the switch component (206) is activated, the capacitor (216) charges to the voltage level of the signal (220) from the photodetector. In practice, the switch component (206) remains open for a relatively short period of time, i.e., for less time than would be required by the ADC (212) to obtain an accurate sample. The signal (220) obtained from the photodetector is therefore referred to as a "signal charge." When the switch (206) is closed, the capacitor has a voltage across it corresponding to the signal charge. The charge amplifier (208) is operative to convert the signal charge to a signal having a more constant voltage, i.e., to stretch out, or regenerate, the signal charge obtained from the photodetector. The amplifier (218) provides the requisite current at that voltage to drive the AGC and ADC. The AGC amplifier (210) amplifies the signal from the charge amplifier to a selected level to provide conditioning, e.g., a desired signal-to-noise ratio. The ADC (212) is operative in response to a clock signal to convert the voltage level provided at the output of the AGC to the digital domain. Typically, the conversion circuit is held for a predetermined settling time between obtaining a signal charge, by opening (or closing) the switch component (206), and activating the ADC (210). Once the ADC has taken a sample, the ADC is clocked, i.e., the input is deactivated, and the charge amplifier switch (214) again is closed in order to reset (null) the charge capacitor (216) by discharging it. By periodically clocking in the described manner, the conversion circuit converts samples of the signal charge to digital electrical form. It should be noted that the charge amplifier can be any component or subsystem capable of stretching the signal charge, and that the amplifier could be any device or subsystem which maintains the voltage corresponding to the signal charge on the capacitor and provides current to drive downstream components.

The conversion circuits are time-interleaved in order to provide the requisite resolution in the digital electrical signal. In a typical application there may be 8, 16 or 32 parallel conversion circuits. In a given cycle each of the conversion circuits takes one sample, and only one conversion circuit is active at any given point in the cycle. In other words, the conversion circuits take samples in a round-robin manner, e.g., conversion circuit ($202_1$) is activated, then deactivated contemporaneously with activating conversion circuit ($202_2$), which is deactivated contemporaneously with activating conversion circuit ($202_3$), and so on.

While the invention is described through the above exemplary embodiments, it will be understood by those of ordinary skill in the art that modification to and variation of the illustrated embodiments may be made without departing from the inventive concepts herein disclosed. Moreover, while the preferred embodiments are described in connection with various illustrative structures, one skilled in the art will recognize that the system may be embodied using a variety of specific structures. Accordingly, the invention should not be viewed as limited except by the scope and spirit of the appended claims.

What is claimed is:

1. Apparatus operable to convert an optical signal to a digital electrical signal comprising:
    at least one photodetector;
    a plurality of parallel conversion circuits interconnectable with the photodetector, each conversion circuit including first switch means for selectively placing the conversion circuit in communication with the photodetector, a charge amplifier operable to produce a voltage corresponding to a signal charge from the photodetector, and an analog to digital converter operable in response to produce a digital electrical representation of the optical signal; and
    a clock operable to time-interleave the conversion circuits by activating the respective first switch means, one at a time, to selectively place each respective conversion circuit in communication with the photodetector once per cycle.

2. The apparatus of claim 1 wherein each conversion circuit further includes an automatic gain control amplifier connected between the charge amplifier and the analog to digital converter.

3. The apparatus of claim 1 wherein each conversion circuit includes a capacitor operable to charge to the level of the signal charge.

4. The apparatus of claim 3 wherein each conversion circuit includes second, reset switch means operable when activated to discharge the capacitor.

5. The apparatus of claim 4 wherein each conversion circuit includes an amplifier operable to provide a signal at the voltage of the capacitor.

6. The apparatus of claim 4 wherein the clock is further operable to activate the respective second, reset switch means to reset the capacitor prior to activating the first switch means to selectively place each respective conversion circuit in communication with the photodetector.

7. The apparatus of claim 6 wherein the clock is further operable, in a cycle, to activate the first switch means, then to deactivate the first switch means following a predetermined period of time, then activate an analog to digital converter input after a predetermined settling time, then deactivate the analog to digital converter input, and then activate the second, reset switch means.

8. A method of converting an optical signal to a digital electrical signal comprising the steps of:
    producing a signal charge from an optical signal with at least one photodetector; and
    with one of a plurality of parallel conversion circuits interconnectable with the photodetector:
        selectively placing the conversion circuit in communication with the photodetector using first switch means with a clock, including time-interleaving the conversion circuits by activating the respective first switch means, one at a time, to selectively place each respective conversion circuit in communication with the photodetector once per cycle,
        producing a voltage corresponding to a signal charge from the photodetector using a charge amplifier, and
        producing a digital electrical representation of the optical signal using an analog to digital converter.

9. The method of claim 8 including the further step of, with the conversion circuit, amplifying a signal from the charge amplifier using an automatic gain control amplifier connected between the charge amplifier and the analog to digital converter.

10. The method of claim 8 including the further step of, with the conversion circuit, charging a capacitor to the level of the signal charge.

11. The method of claim 10 including the further step of, with the conversion circuit, discharging the capacitor with a second, reset switch means.

12. The method of claim 11 including the further step of, with the conversion circuit, providing a signal at the voltage of the capacitor using an amplifier.

13. The method of claim 11 including the further step of, with the clock, activating the respective second, reset switch means to reset the capacitor prior to activating the first switch means to selectively place each respective conversion circuit in communication with the photodetector.

14. The method of claim 13 including the further steps of, with the clock in a cycle of the conversion circuit, activating the first switch means, then deactivating the first switch means following a predetermined period of time, then activating an analog to digital converter input after a predetermined settling time, then deactivating the analog to digital converter input, and then activating the second, reset switch means.

* * * * *